(12) United States Patent
Kim et al.

(10) Patent No.: US 9,340,902 B2
(45) Date of Patent: May 17, 2016

(54) MAGNETOELECTRIC MATERIAL AND METHOD OF MANUFACTURING THE SAME

(71) Applicant: SNU R&DB FOUNDATION, Seoul (KR)

(72) Inventors: Kee Hoon Kim, Seoul (KR); Sae Hwan Chun, Seoul (KR); Yi Sheng Chai, Seoul (KR); Kwang Woo Shin, Gwangmyeong-si (KR)

(73) Assignee: SNU R&DB FOUNDATION, Seoul (KR)

( * ) Notice: Subject to any disclaimer, the term of this patent is extended or adjusted under 35 U.S.C. 154(b) by 151 days.

(21) Appl. No.: 14/083,160

(22) Filed: Nov. 18, 2013

(65) Prior Publication Data
US 2014/0138571 A1 May 22, 2014

Related U.S. Application Data

(60) Provisional application No. 61/728,186, filed on Nov. 19, 2012.

(30) Foreign Application Priority Data

Nov. 16, 2012 (KR) .......................... 10-2012-0130483
Aug. 28, 2013 (KR) .......................... 10-2013-0102558

(51) Int. Cl.
| | |
|---|---|
| *H01F 1/01* | (2006.01) |
| *C30B 11/00* | (2006.01) |
| *C30B 29/22* | (2006.01) |
| *H01F 1/10* | (2006.01) |
| *C04B 35/26* | (2006.01) |
| *C04B 35/626* | (2006.01) |
| *C04B 35/653* | (2006.01) |
| *C01G 51/00* | (2006.01) |

(52) U.S. Cl.
CPC .............. *C30B 29/22* (2013.01); *C01G 51/006* (2013.01); *C04B 35/26* (2013.01); *C04B 35/62645* (2013.01); *C04B 35/653* (2013.01); *C30B 11/003* (2013.01); *H01F 1/10* (2013.01); *C01P 2006/40* (2013.01); *C01P 2006/42* (2013.01); *C04B 2235/3201* (2013.01); *C04B 2235/3206* (2013.01); *C04B 2235/3208* (2013.01); *C04B 2235/3213* (2013.01); *C04B 2235/3215* (2013.01); *C04B 2235/3217* (2013.01); *C04B 2235/3224* (2013.01); *C04B 2235/3225* (2013.01); *C04B 2235/3262* (2013.01); *C04B 2235/3275* (2013.01); *C04B 2235/3279* (2013.01); *C04B 2235/3281* (2013.01); *C04B 2235/3284* (2013.01); *C04B 2235/6565* (2013.01); *C04B 2235/6567* (2013.01); *C04B 2235/767* (2013.01); *H01F 1/01* (2013.01)

(58) Field of Classification Search
CPC ......... H01F 1/01; C30B 11/003; C30B 29/22; C04B 35/2633
See application file for complete search history.

(56) References Cited

U.S. PATENT DOCUMENTS

| | | | |
|---|---|---|---|
| 8,275,427 B2 | 9/2012 | Kim et al. | |
| 8,597,533 B2 * | 12/2013 | Kim et al. ................. | 252/62.58 |
| 2003/0224154 A1 * | 12/2003 | Umemoto et al. ............ | 428/210 |

FOREIGN PATENT DOCUMENTS

| | | | |
|---|---|---|---|
| JP | 2011-135018 | * | 7/2011 |
| JP | 2011-135018 A | | 7/2011 |
| JP | 2011-521865 A | | 7/2011 |
| WO | WO 2010/039012 | * | 4/2010 |

OTHER PUBLICATIONS

Wang et al, "Low magnetic field reversal of electric polarization in a Y-type hexaferrite", Applied Physics Letters, 100, 122901: 1-5, Mar. 19, 2012.*

* cited by examiner

*Primary Examiner* — Carol M Koslow

(57) ABSTRACT

The present invention provides a magnetoelectric material in which an electric property is capable of being controlled by a magnetic field or a magnetic property is capable of being controlled by an electric field, and a method of manufacturing the same. Particularly, the present invention provides a magnetoelectric material in which a distance between magnetic ions interacting with each other is controlled by using non-magnetic ions or alkaline earth metal ions, and a method of manufacturing the same.

11 Claims, 12 Drawing Sheets

MAGNETOELECTRIC MATERIAL AND METHOD OF MANUFACTURING THE SAME

CROSS-REFERENCE TO RELATED APPLICATIONS

This application claims priority to and the benefit of Korean Patent Application Nos. 10-2012-0130483 filed on Nov. 16, 2012 and 10-2013-0102558 filed on Aug. 28, 2013 in the Korean Intellectual Property Office and U.S. Provisional Patent Application No. 61/728,186 filed on Nov. 19, 2012 in the United States Patent and Trademark Office, the entire contents of which are incorporated herein by reference.

TECHNICAL FIELD

The present invention relates to a magnetoelectric material and a method of manufacturing the same. More particularly, the present invention relates to a magnetoelectric material in which an electric property is capable of being controlled by a magnetic field or a magnetic property is capable of being controlled by an electric field, and a method of manufacturing the same.

BACKGROUND ART

A magnetoelectric material is a material having a magnetoelectric effect, and has all of a property reacting with an external magnetic field, such as ferromagnetism, ferrimagnetism, and antiferromagnetism, and a property reacting with an external electric field, such as ferroelectricity, ferrielectrics, and antiferroelectricity. Therefore, if the magnetoelectric material is exposed to a magnetic field, an electric voltage occurs, and if the magnetoelectric material is exposed to an electric field, a magnetization phenomenon occurs.

Recently, a study of an applicable element using functionality of the magnetoelectric material has been actively conducted. However, in order to successfully commercialize the applicable element, the magnetoelectric material should have both ferromagnetism and ferroelectricity at normal temperatures, and should have the magnetoelectric effect at a temperature of normal temperature or higher, at which the applicable element is actually used. However, in known magnetoelectric materials, since a physical property that is capable of inducing a change in magnetic susceptibility by the electric field occurs only at an extremely low temperature, there is a limitation in application of the known magnetoelectric materials to an electromagnetic material field.

Meanwhile, an example of a patent disclosing the magnetoelectric material includes U.S. Pat. No. 8,275,427. However, in this patent, only a device and a method of measuring the magnetoelectric effect of the magnetoelectric material are described, and thus this patent cannot solve the aforementioned problem.

SUMMARY OF THE INVENTION

The present invention has been made in an effort to provide a magnetoelectric material in which a distance between magnetic ions interacting with each other is controlled by using non-magnetic ions or alkaline earth metal ions, and a method of manufacturing the same.

However, the object of the present invention is not limited to the aforementioned matter, and unmentioned other objects may be clearly understood by the person with ordinary skill in the art from the following description.

An exemplary embodiment of the present invention provides a magnetoelectric material including: at least one ion of a non-magnetic ion and an alkaline earth metal ion; and magnetic ions interacting with each other, in which a distance between the magnetic ions is controlled by the non-magnetic ion or the alkaline earth metal ion.

Preferably, the magnetoelectric material is a single crystal in which a magnetic property is controlled by an electric field at normal temperature.

Preferably, the magnetoelectric material is a Y-type or Z-type hexaferrite material.

Preferably, in the magnetoelectric material, the distance between the magnetic ions is controlled by positioning the non-magnetic ion between the magnetic ions and adjusting a size of the non-magnetic ion, or the distance between the magnetic ions is controlled by substituting some of first ions that correspond to Ba ions in the Y-type or Z-type hexaferrites by second ions.

Preferably, the magnetic ions include iron ions, and the non-magnetic ion is an ion substituted from a portion of the iron ions.

Preferably, the non-magnetic ion corresponds to an aluminum ion or a gallium ion.

Preferably, a substitution ratio to the non-magnetic ion is more than 0% and 80% or less.

Preferably, as the alkaline earth metal ion, only a first alkaline earth metal ion is included, only a second alkaline earth metal ion is included, or all of the first alkaline earth metal ion and the second alkaline earth metal ion are included.

Preferably, when all of the first alkaline earth metal ion and the second alkaline earth metal ion are included, the second alkaline earth metal ion is an ion substituted from a portion of the first alkaline earth metal ion.

Preferably, the first ions correspond to barium ions, and the second ions correspond to at least one of strontium (sr) ions, calcium (Ca) ions, scandium (Sc) ions, yttrium (Y) ions, gadolinium (Gd) ions, terbium (Tb) ions, dysprosium (Dy) ions, holmium (Ho) ions, erbium (Er) ions, thulium (Tm) ions, ytterbium (Yb) ions, and lutetium (Lu) ions. The yttrium group elements are elements having a relatively weak basic property of hydroxides among rare earth elements, and elements from gadolinium (Gd) having an atomic number of 64 to ruthenium (Lu) having an atomic number of 71 correspond thereto.

Preferably, the magnetoelectric material further includes an improvement ion for increasing a resistance value and a degree of magnetic arrangement at normal temperature.

Preferably, the improvement ion includes a metal ion selected from manganese, cobalt, nickel, copper, magnesium, and zinc.

Preferably, the magnetoelectric material is included in any one of a magnet generating a magnetic field by application of the electric field, a memory element, and a microwave control element.

Preferably, the magnetoelectric material is manufactured by mixing at least one of barium carbonate and strontium carbonate including the barium ion and the strontium ion, respectively, as the alkaline earth metal ion, iron oxide including the iron ions as the magnetic ions, aluminum oxide including the aluminum ion as the non-magnetic ion, cobalt oxide, and sodium oxide.

Preferably, the magnetoelectric material is manufactured by mixing at least one of barium carbonate and strontium carbonate, iron oxide, aluminum oxide, cobalt oxide, and sodium oxide according to each molar ratio of the following Equation.

Molar ratio of barium carbonate=$A_1(1-x')$

Molar ratio of strontium carbonate=$A_1(x')$

Molar ratio of cobalt oxide=$A_2$

Molar ratio of iron oxide=$A_3(1-y)$

Molar ratio of aluminum oxide=$A_3 y$

Molar ratio of sodium oxide=$A_4$  [Equation]

In the above, $15 \leq A_1 \leq 25$, $15 \leq A_2 \leq 25$, $40 \leq A_3 \leq 60$, $5 \leq A_4 \leq 10$, $A_1+A_2+A_3+A_4=100$, $0 \leq x' \leq 1.0$, and $0 \leq y \leq 0.8$.

Preferably, the magnetoelectric material is manufactured as a crystal by mixing at least one of barium carbonate and strontium carbonate, iron oxide, aluminum oxide, cobalt oxide, and sodium oxide, performing heat-treating at least one time, and performing slow cooling.

Another exemplary embodiment of the present invention provides a method of manufacturing a magnetoelectric material, including: mixing a first powder including magnetic ions, a second powder including a non-magnetic ion, a third powder including an alkaline earth metal ion, and a fourth powder including an improvement ion for increasing a resistance value and a degree of magnetic arrangement at normal temperature; heat-treating the mixed powders at least one time; and manufacturing a crystal by slowly cooling the heat-treated powders.

Preferably, in the mixing, iron oxide is used as the first powder, aluminum oxide or gallium oxide is used as the second powder, a matter selected from strontium carbonate, calcium carbonate, and yttrium carbonate, or barium carbonate is used as the third powder, a matter selected from cobalt oxide, magnesium oxide, nickel oxide, copper oxide, and manganese oxide is used as the fourth powder, and sodium oxide is further used as a fifth powder.

Preferably, in the mixing, at least one of barium carbonate and strontium carbonate, iron oxide, aluminum oxide, cobalt oxide, and sodium oxide are mixed according to each molar ratio of the following Equation.

Molar ratio of barium carbonate=$A_1(1-x')$

Molar ratio of strontium carbonate=$A_1(x')$

Molar ratio of cobalt oxide=$A_2$

Molar ratio of iron oxide=$A_3(1-y)$

Molar ratio of aluminum oxide=$A_3 y$

Molar ratio of sodium oxide=$A_4$  [Equation]

In the above, $15 \leq A_1 \leq 25$, $15 \leq A_2 \leq 25$, $40 \leq A_3 \leq 60$, $5 \leq A_4 \leq 10$, $A_1+A_2+A_3+A_4=100$, $0 \leq x' \leq 1.0$, and $0 \leq y \leq 0.8$.

Preferably, the heat-treating includes heating the mixed powders to a first temperature; maintaining the first temperature for a first time; and cooling the mixed powders to a second temperature.

Preferably, when the heat-treating is repeatedly performed, in the heating, the same temperature as a former temperature is used or a temperature that is lower than the former temperature is used as the first temperature, when the heat-treating is repeatedly performed, in the cooling, the same temperature as a former temperature is used or a temperature that is higher than the former temperature is used as the second temperature, and when the heat-treating is repeatedly performed, in the maintaining, a time that is shorter than an initial time is used as the first time.

Preferably, in the heating, the first temperature is 1,100° C. to 1,500° C. and a temperature increase ratio is 50° C./h to 1,500° C./h, in the maintaining, the first time is 5 hours to 30 hours, and in the cooling, the second temperature is 900° C. to 1,200° C. and a temperature decrease ratio is 50° C./h to 1,500° C./h.

Preferably, in the manufacturing, when the heat-treated powders are repeatedly subjected to slow cooling, a temperature decrease ratio that is higher than a former temperature decrease ratio is used.

Preferably, in the manufacturing, the temperature decrease ratio during the slow cooling is 0.1° C./h to 100° C./h.

Another exemplary embodiment of the present invention provides a magnetoelectric material in which an electric property is controlled by a magnetic field or a magnetic property is controlled by an electric field by including a non-magnetic ion or an alkaline earth metal ion in the material including magnetic ions.

The present invention may obtain the following effects according to the aforementioned object.

First, a magnetoelectric material may generate a magnetoelectric effect at normal temperature while the magnetoelectric material has both ferromagnetism and ferroelectricity by controlling a distance between magnetic ions interacting with each other by using non-magnetic ions or alkaline earth metal ions.

The present invention discloses Z-type hexaferrite and Y-type hexaferrite as the magnetoelectric material. In the case of Z-type hexaferrite, it is possible to implement a phenomenon that is capable of inducing magnetic susceptibility by an electric field at normal temperature by substituting an appropriate amount of barium ions existing between the magnetic ions such as iron and cobalt by strontium ions. In the case of Y-type hexaferrite, it is possible to implement the phenomenon that is capable of inducing magnetic susceptibility by the electric field at normal temperature by substituting an appropriate amount of iron ions by the non-magnetic ions such as aluminum ions.

Second, it is possible to improve functionality of a memory element or an applicable electronic element by inducing a change in magnetic susceptibility by the electric field.

The magnetoelectric material according to the present invention can induce the change in magnetic susceptibility of 0.01% to 20% by the electric field of 1 MV/m. The magnetoelectric material according to the present invention can change the magnetic susceptibility induced by the electric field according to a state of a magnetoelectric domain. The magnetoelectric material according to the present invention can be applied to a memory element field by using the change in magnetic susceptibility induced by the electric field varying according to information of the magnetoelectric domain.

It is possible to apply the magnetoelectric material to a microwave circulator, a phase shifter, a filter, and the like of microwave electronic elements using known hexaferrite by using a property of inducing the change in magnetic susceptibility by the electric field.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
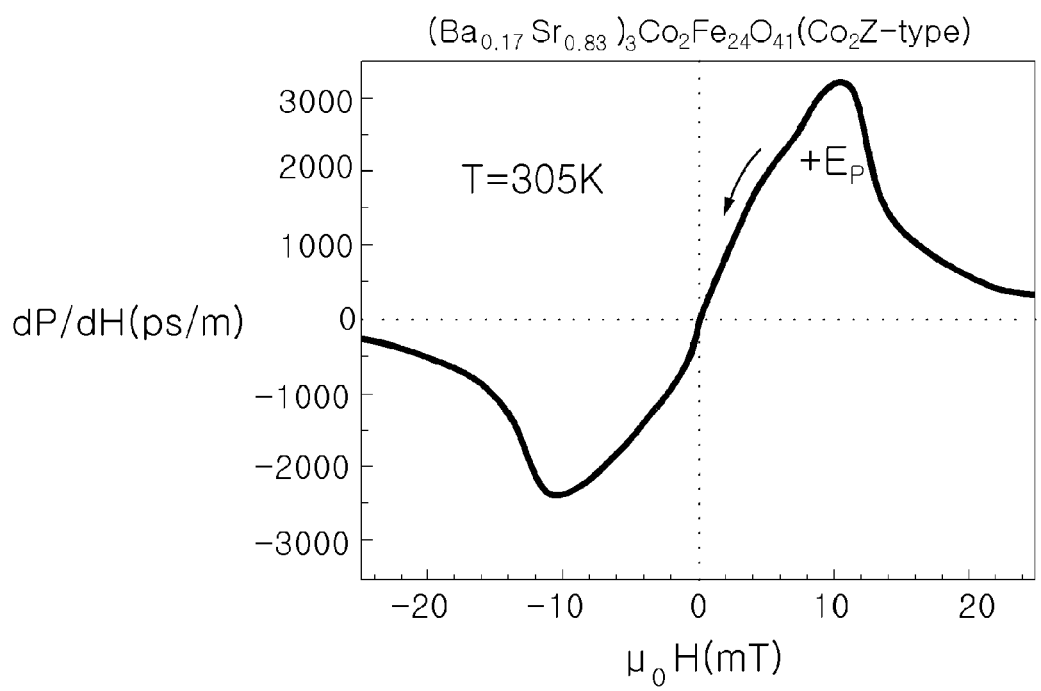
FIG. 1 is a graph illustrating a change in magnetoelectric susceptibility of Z-type hexaferrite according to an exemplary embodiment of the present invention at normal temperature.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, the preferred exemplary embodiments according to the present invention will be described in detail with reference to the accompanying drawings. First, in addition of reference numerals to constituent elements of each drawing, it should be noted that like reference numerals are used for like and corresponding parts even though the parts are illustrated in the different drawings. In the description of the present disclosure, the detailed descriptions of known related constitutions or functions thereof may be omitted if they make the gist of the present invention unclear. Hereinafter, preferred embodiments of the present invention will be described, but, of course, the technical spirit of the present invention is not restricted or limited thereto, but may be modified by the person with ordinary skill in the art to be variously performed.

The present invention provides a magnetoelectric material in which an electric property is capable of being controlled by a magnetic field or a magnetic property is capable of being controlled by an electric field, and a method of manufacturing the same. Particularly, the present invention provides a magnetoelectric material in which a distance between magnetic ions interacting with each other is controlled by using non-magnetic ions or alkaline earth metal ions, and a method of manufacturing the same. According to the present invention, the magnetoelectric material is capable of inducing a change in magnetic susceptibility of at least 0.01% to at most 20% by the electric field at normal temperature due to a change in chemical compositional ratio, and a change aspect in magnetic susceptibility induced by the electric field varies according to a magnetoelectric state, and thus the magnetoelectric material is capable of being variously applied in an electromagnetic material field.

A first object of the present invention is to provide a magnetoelectric material that is capable of inducing a change in magnetic susceptibility by an electric field. A second object of the present invention is to provide a method of manufacturing the magnetoelectric material.

According to exemplary embodiments of the present invention for accomplishing the first object, the magnetoelectric material includes hexaferrites where chemical compositional ratios are different.

A change in chemical compositional ratio should be capable of changing an interaction between magnetic ions in hexaferrite. To this end, an interaction distance may be adjusted by positioning non-magnetic ions between the magnetic ions. An interaction size may be adjusted through substitution of the magnetic ion and the non-magnetic ion.

Hexaferrite may induce the change in magnetic susceptibility by the electric field. Hexaferrite may induce the change in magnetic susceptibility of at least 0.01% to at most 20% by the electric field by reducing a radius of the non-magnetic ion positioned between the magnetic ions.

In hexaferrite, a change aspect in magnetic susceptibility induced by the electric field may vary according to a state of a magnetoelectric domain arranged in advance in a state where there is no external magnetic field. The changed magnetic susceptibility may be maintained even after the electric field is applied.

In a composition aspect, hexaferrite may be represented by $(Ba,A)_3B_2(Fe,C)_{24}O_{41}$ or $(Ba,A)_2B_2(Fe,C)_{12}O_{22}$. Herein, an element A may be one or more of strontium (Sr) and calcium (Ca). An element B may be one or more of manganese (Mn), cobalt (Co), nickel (Ni), copper (Cu), magnesium (Mg), and zinc (Zn). An element C may be one or more of aluminum (Al) and gallium (Ga).

For example, hexaferrite may be represented by $(Ba_{1-x}Sr_x)_3Co_2(Fe_{1-y}Al_y)_{24}O_{41}$ or $(Ba_{1-x}Sr_x)_2Co_2(Fe_{1-y}Al_y)_{12}O_{22}$ ($0 \leq x \leq 1.0$, $0 \leq y \leq 0.8$). Hexaferrite may be a Z-type or a Y-type.

According to the exemplary embodiments of the present invention for accomplishing the second object, in order to manufacture the magnetoelectric material, powders of barium carbonate, strontium carbonate, cobalt oxide, iron oxide, aluminum oxide, and sodium oxide are prepared. The powders are heat-treated one or more times. Thereafter, slow cooling is performed for crystallization.

Molar ratios of barium carbonate, strontium carbonate, cobalt oxide, iron oxide, aluminum oxide, and sodium oxide are each $A_1(1-x')$, $A_2$, $A_3(1-y)$, $A_3y$, and $A_4$, $A_1$, $A_2$, $A_3$, and $A_4$ are each selected in the range of $15 \leq A_1 \leq 25$, $15 \leq A_2 \leq 25$, $40 \leq A_3 \leq 60$, and $5 \leq A_4 \leq 10$ so that a sum of $A_1$, $A_2$, $A_3$, and $A_4$ is 100, and x' and y may be each selected in the range of $0 \leq x' \leq 1.0$ and $0 \leq y \leq 0.8$.

Heat-treating may include heating the powders to a first temperature, maintaining the powders at the first temperature, and cooling the powders from the first temperature to a second temperature that is lower than the first temperature. Herein, the first temperature may be selected from about 1,100° C. to about 1,500° C., and the second temperature may be selected from about 900° C. to about 1,200° C.

In the heating, a temperature increase ratio may be about 50° C./h to about 1,500° C./h. In the cooling, a temperature decrease ratio may be about 50° C./h to about 1500° C./h.

The heat-treating may be performed two or more times, and in this case, the first temperature may be sequentially decreased or maintained to be the same as the temperature at the previous heat-treating step whenever the heat-treating is performed, and the second temperature may be sequentially increased or maintained to be the same as the temperature at the previous heat-treating step whenever the heat-treating is performed.

In the case where the heat-treating is performed two or more times, the maintaining in the initial heat-treating may be performed for about 5 hours to about 30 hours, and the maintaining in the subsequent heat-treating may be performed for about 5 hours or less.

In the slow cooling, the temperature decrease ratio may be about 0.1° C./h to about 100° C./h. For example, the slow cooling may include first slow cooling performed at about 0.1° C./h to about 10° C./h, and second slow cooling performed at about 10° C./h to about 100° C./h.

—Magnetoelectric Material—

The magnetoelectric material according to the present invention may include Z-type or Y-type single crystal hexaferrite. In this case, in hexaferrite, barium ions ($Ba^{2+}$) that are alkaline earth metal between magnetic iron ions ($Fe^{3+}$) are partially substituted by other alkaline earth metal ions, or the iron ions are partially substituted by the non-magnetic ions.

The alkaline earth metal ion is capable of being substituted by the barium ion, and should satisfy a condition predicted to change a transverse conical magnetic arrangement temperature of hexaferrite. A strontium ion ($Sr^{2+}$) may be used as the alkaline earth metal ion.

The non-magnetic ion is capable of being substituted by the iron ion, and should satisfy a condition predicted to change magnetic anisotropy of hexaferrite. An aluminum ion ($Al^{3+}$) may be used as the non-magnetic ion.

The alkaline earth metal ion has a radius that is smaller than that of the barium ion positioned between the magnetic iron ions, thus reducing a distance between the magnetic ions when the barium ion is substituted. Accordingly, an interaction between the magnetic ions may be changed, and thus magnetoelectricity caused by transverse conical magnetic arrangement may exist at normal temperature. Accordingly, the change in magnetic susceptibility of hexaferrite may be induced by the electric field, and the change in magnetic susceptibility of at least 0.01% to at most about 20% may be caused by the electric field of 1 MV/m. For example, the change in magnetic susceptibility of about 4% to 10% may occur. The non-magnetic ion may be substituted by iron to change the magnetic anisotropy of hexaferrite, and thus magnetoelectricity caused by the transverse conical magnetic arrangement may exist at normal temperature as a substitution amount of the non-magnetic ion is increased. Accordingly, the change in magnetic susceptibility of hexaferrite may be induced by the electric field, and the change in magnetic susceptibility of at least 0.01% to at most about 20% may be caused by the electric field of 1 MV/m. For example, the change in magnetic susceptibility of about 1% may occur.

In the case where the barium ion is not substituted by the other alkaline earth metal ion and the substitution ratio is 0%, since the transverse conical magnetic arrangement exists at only low temperatures, a change effect in magnetic susceptibility induced by the electric field at normal temperature is not exhibited. On the other hand, if the substitution ratio of the other alkaline earth metal ion to the barium ion is about 100%, it may be difficult to grow a pure single crystal and the size of the magnetic susceptibility that is capable of being changed by the electric field may be reduced. Therefore, the substitution ratio of the alkaline earth metal ion to the barium ion may be about 0% or more and 100% or less. Preferably, the substitution ratio may be about 83% to 85%.

In the case where the iron ion is not substituted by the non-magnetic ion and the substitution ratio is 0%, the transverse conical magnetic arrangement exists at only low temperatures due to the magnetic anisotropy, and thus the change effect in magnetic susceptibility induced by the electric field at normal temperature is not exhibited. On the other hand, in the case where the substitution ratio of the non-magnetic ion to the iron ion is more than about 80%, it is difficult to grow the pure single crystal and the size of the magnetic susceptibility that is capable of being changed by the electric field is reduced. Therefore, the substitution ratio of the non-magnetic ion to the iron ion may be 0% or more or about 80% or less. Preferably, the substitution ratio may be 0% or more or about 8% or less.

Hexaferrite may be represented by $(Ba,A)_3B_2(Fe,C)_{24}O_{41}$ or $(Ba,A)_2B_2(Fe,C)_{12}O_{22}$. Herein, the element A may be one or more of strontium (Sr) and calcium (Ca). The element B may be one or more of manganese (Mn), cobalt (Co), nickel (Ni), copper (Cu), magnesium (Mg), and zinc (Zn). The element C may be one or more of aluminum (Al) and gallium (Ga).

Herein, as described above, the substitution ratio of the alkaline earth metal ion to the barium ion is 0% or more and 100% or less, which is represented by 0≤x≤1.0 using x. The substitution ratio of the aluminum ion that is the non-magnetic ion to the iron ion is 0% or more and about 80% or less, which is represented by 0≤y≤0.8 using y. The element A, the element B, and the element C form a trigonal system crystal structure together with barium, iron, and oxygen. For example, Z-type and Y-type hexaferrites may be represented by the following Chemical Formulas 1 and 2, respectively.

$(Ba_{1-x}Sr_x)_3Co_2(Fe_{1-y}Al_y)_{24}O_{41}$ (0≤x≤1.0, 0≤y≤0.8) Chemical Formula 1

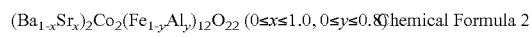

$(Ba_{1-x}Sr_x)_2Co_2(Fe_{1-y}Al_y)_{12}O_{22}$ (0≤x≤1.0, 0≤y≤0.8) Chemical Formula 2

Meanwhile, the magnetoelectric material according to the present invention is a hexaferrite single crystal. Hereinafter, a characteristic of the single crystal will be described as compared to the polycrystal.

① In the case of the polycrystal, there is a disadvantage in that since crystal grains are mixed in a random direction, a magnetoelectric effect is equalized in various directions, and thus the effect is reduced. On the other hand, in the case of the single crystal, the magnetic field or the electric field may be applied in a certain crystal axis direction to induce the magnetoelectric effect maximized in this direction.

ex) Magnetoelectric Susceptibility at Normal Temperature
$(Ba,Sr)_3Co_2Fe_{24}O_{41}$ single crystal: 3,500 ps/m
$Sr_3Co_2Fe_{24}O_{41}$ polycrystal: 250 ps/m In the above, a ps/m value means a coupling intensity of an electric property and a magnetic property causing the magnetoelectric effect.

② In the case of the polycrystal, since the crystal grains are mixed in a random direction, only two magnetoelectric states are substantially feasible, and only the two magnetoelectric effects may be induced. On the other hand, in the case of the single crystal, at least four magnetoelectric states may be made by the magnetic field and the electric field each applied in a vertical direction to a certain crystal axis direction. Accordingly, the different magnetoelectric effects may be induced according to the prepared magnetoelectric state. The four magnetoelectric states and each magnetoelectric effect that are feasible only in the case of the single crystal are the same as matters illustrated in FIGS. 4 and 5.

Figure 10:
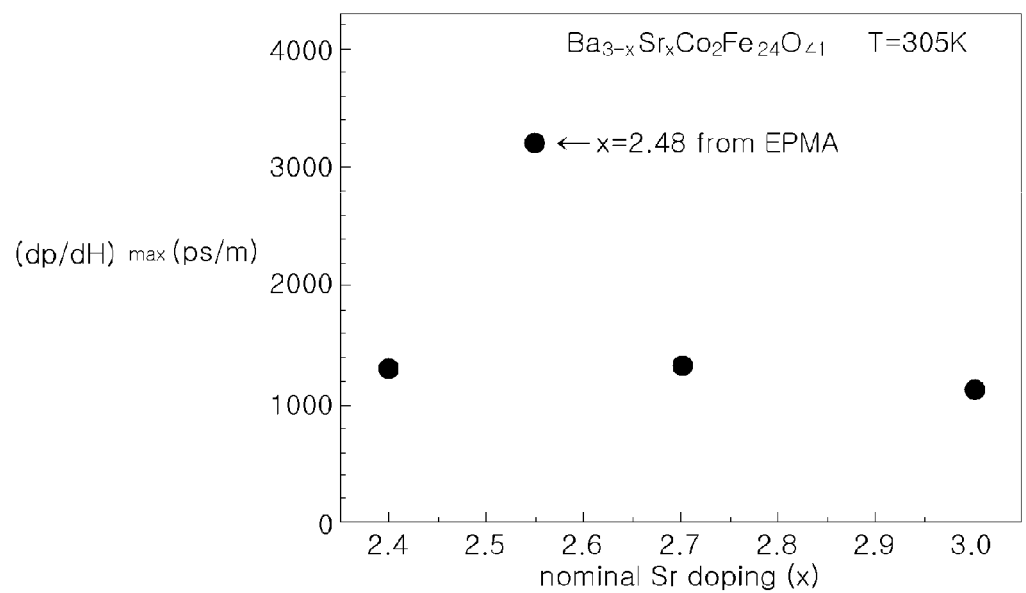
FIGS. 10 and 11 illustrate an Experimental Example regarding a method of adjusting a property of the magnetoelectric material by substitution or size regulation of non-magnetic ions.
Figure 11:
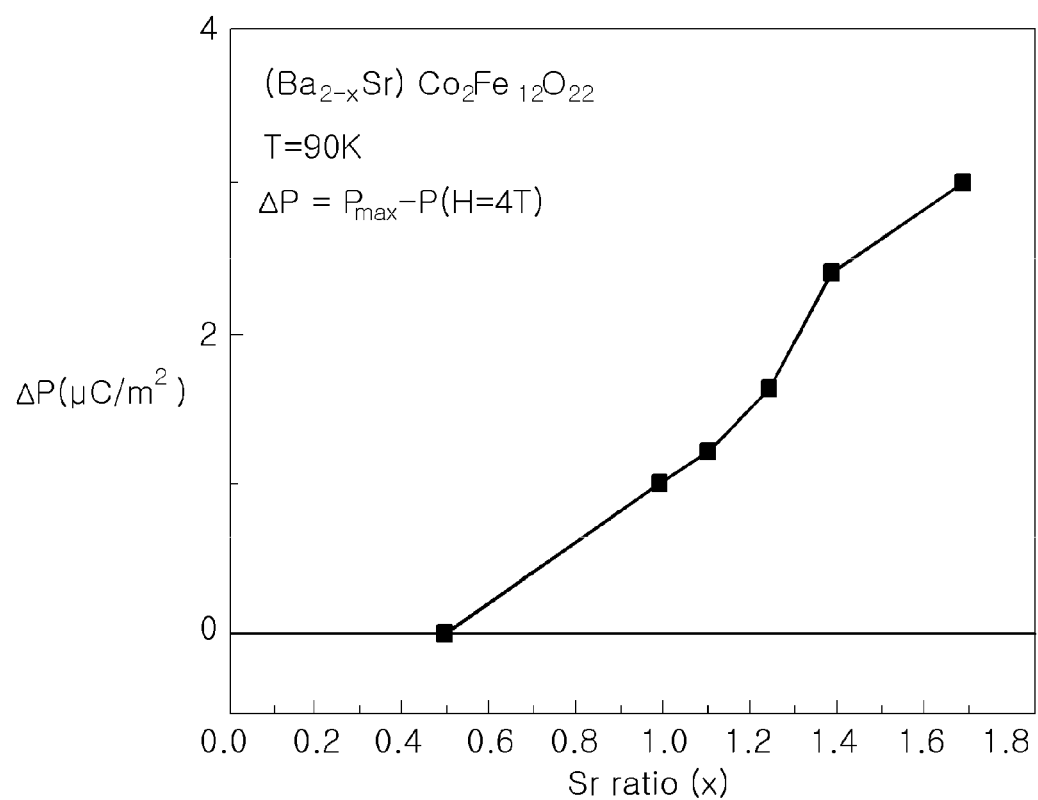

③ In the single crystal according to the present invention, the Ba ion may replace the Sr ion. Since the Ba ion has an ion radius that is smaller than that of the Sr ion, the intensity of a magnetic interaction between the Fe ions in a sample may be controlled. Accordingly, in the single crystal according to the present invention, a chemical composition maximizing the magnetoelectric effect becomes feasible by controlling the intensity of the magnetic interaction.

ex) Magnetoelectric Susceptibility at Normal Temperature
$(Ba,Sr)_3Co_2Fe_{24}O_{41}$ single crystal: 3,500 ps/m
$Sr_3Co_2Fe_{24}O_{41}$ polycrystal obtained by arranging the crystal grains in a predetermined direction: 1,500 ps/m FIGS. 10 and 11 illustrate an Experimental Example regarding a method of adjusting a property of the magnetoelectric material by substitution or size regulation of non-magnetic ions between the magnetic ions in hexaferrite. FIG. 10 illustrates an example of $Ba_{3-x}Sr_xCo_2Fe_{24}O_{41}$, and FIG. 11 illustrates an example of $Ba_{2-x}Sr_xCo_2Fe_{12}O_{22}$. Referring to FIGS. 10 and 11, it can be confirmed that the magnetoelectric coupling may be changed according to an ion size by regulating a ratio between Ba and Sr in $Co_2Z$ hexaferrite.

Figure 12:
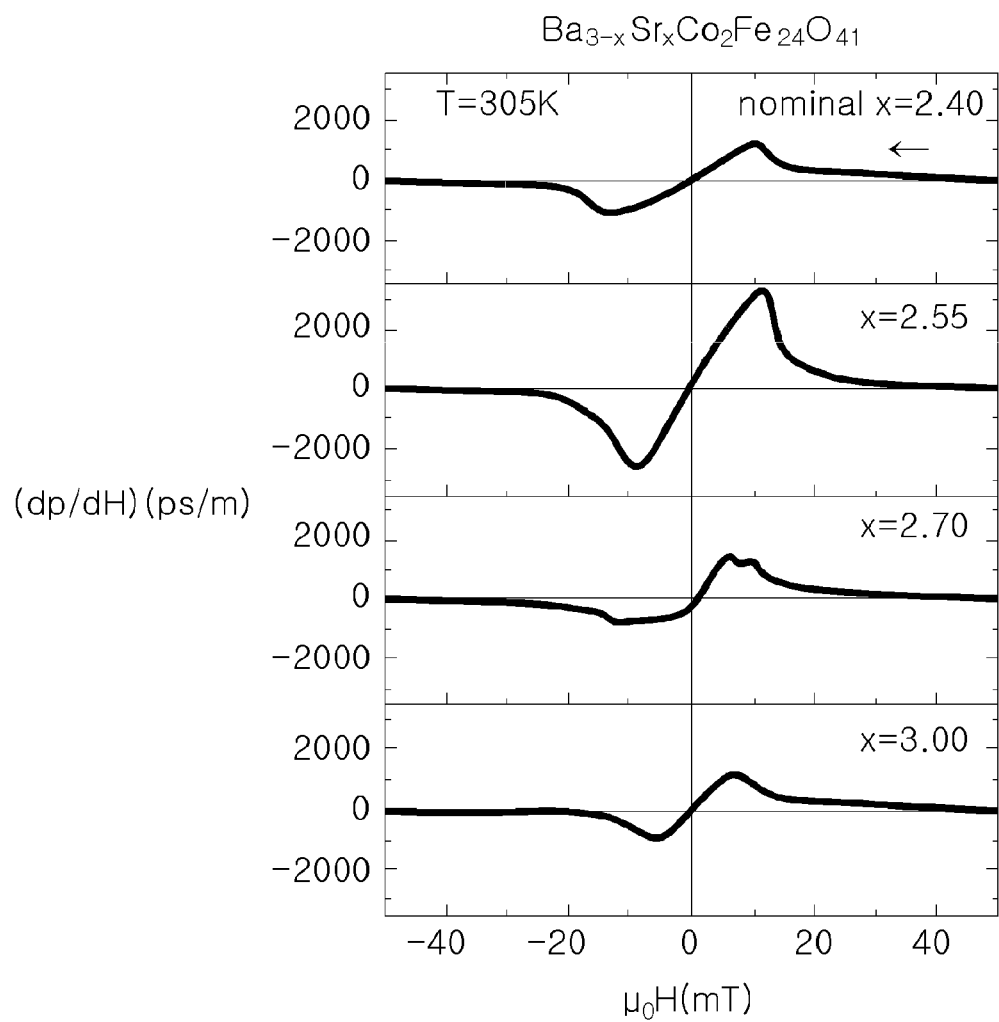
FIG. 12 is a view illustrating a change in MES value of $Co_2Z$ hexaferrite according to contents of Sr and Ba.

FIG. 12 is a view illustrating a change in MES value of $Co_2Z$ hexaferrite according to contents of Sr and Ba. The MES (magnetoelectric susceptibility) is a physical quantity exhibiting how sensitively electric polarization according to the external magnetic field or magnetic susceptibility according to the external electric field is changed. Referring to the Experimental Example of FIG. 12, it can be seen that when Sr is 2.55, the change in magnetic susceptibility according to the external electric field is largest.

Figure 13:
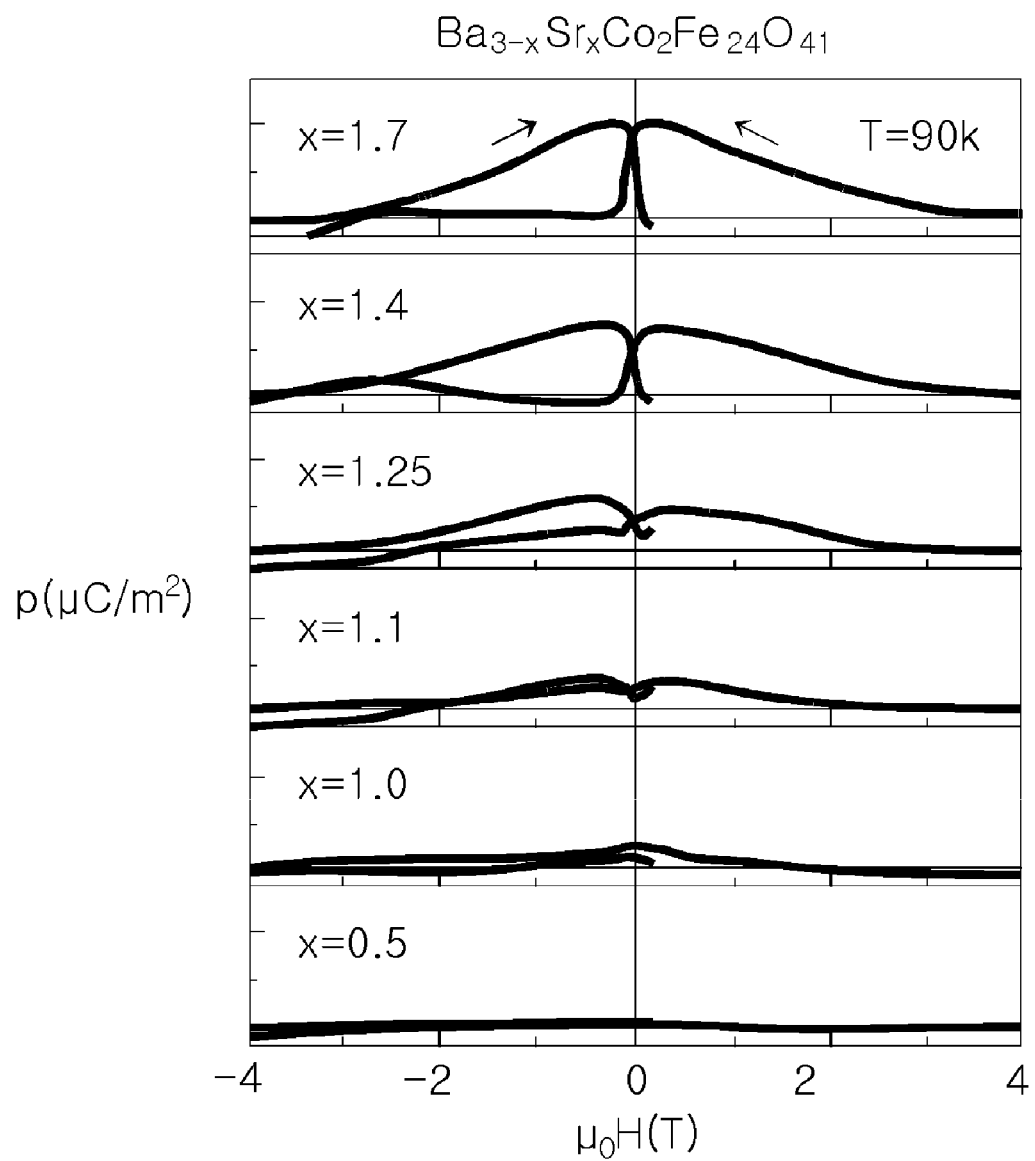
FIG. 13 is a view illustrating a change in electric polarization according to an external magnetic field of $Co_2Y$ hexaferrite according to the contents of Sr and Ba.

FIG. 13 is a view illustrating a change in electric polarization according to the external magnetic field of $Co_2Y$ hexaferrite according to the contents of Sr and Ba. In FIG. 13, it can be seen that the intensity of the electric polarization varies according to the contents of Ba and Sr. FIG. 13 is not a direct verification regarding a change in converse ME effect at normal temperature according to substitution of the non-magnetic ion, but the converse ME effect may be indirectly predicted by the ME effect.

—Change in Magnetic Susceptibility Induced by Electric Field—

Z-type hexaferrite $(Ba_{1-x}Sr_x)_3Co_2(Fe_{1-y}Al_y)_{24}O_{41}$ ($0 \leq x \leq 1.0$, $0 \leq y \leq 0.8$) has the magnetoelectric effect due to the transverse conical magnetic arrangement. A temperature at which the transverse conical magnetic arrangement is exhibited is increased as the substitution amount (x) of the strontium ion ascends, and thus the magnetoelectric effect may be exhibited at normal temperature.

Referring to FIG. 1, it can be seen that the magnetoelectric susceptibility (dP/dH) of $(Ba_{0.17}Sr_{0.83})_3Co_2Fe_{24}O_{41}$ at 305 K reaches at most 3,200 ps/m and at least −2,500 ps/m in an environment of the external magnetic fields (H) of 10.5 mT and −10.5 mT. Therefore, if the electric field is applied in a state where the external magnetic fields of 10.5 mT and −10.5 mT are applied, the change in magnetic susceptibility may be most largely exhibited.

Figure 2:
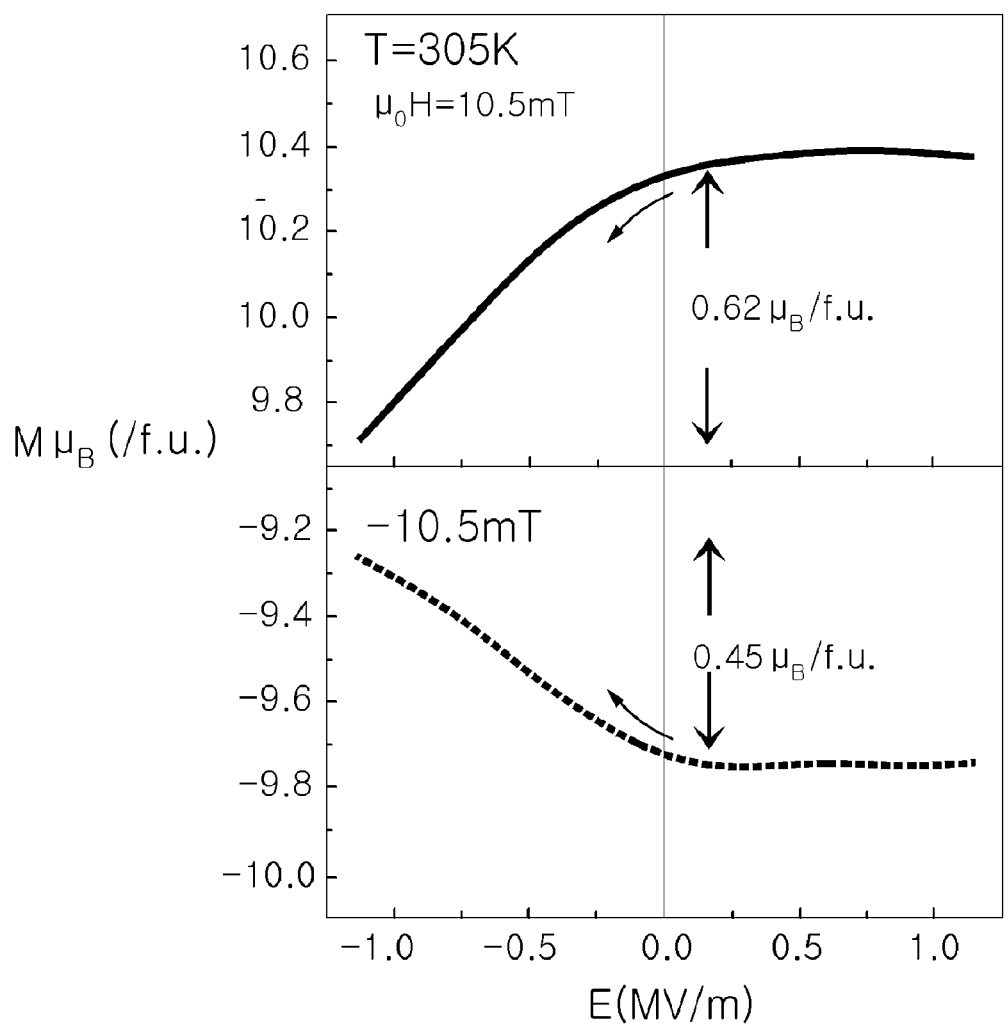
FIG. 2 is a graph illustrating a change in magnetic susceptibility of Z-type hexaferrite, which is induced by an electric field, according to the exemplary embodiment of the present invention at normal temperature.

FIG. 2 is a result obtained by inducing the change in magnetic susceptibility by applying the electric field in the environment of the external magnetic fields of 10.5 mT and −10.5 mT. The change in magnetic susceptibility of 0.62 and 0.45 $\mu_B$/f.u. may be induced by the electric field of about 1 MV/m. These are each a change of 6.0% and 4.6% to a value of magnetic susceptibility in the case where the electric field is "0".

Y-type hexaferrite $(Ba_{1-x}Sr_x)_2Co_2(Fe_{1-y}Al_y)_{12}O_{22}$ has the magnetoelectric effect due to the transverse conical magnetic arrangement. The temperature at which the transverse conical magnetic arrangement is exhibited is increased as the substitution amount y of the aluminum ion is increased, and thus the magnetoelectric effect may be exhibited at normal temperature.

Figure 3:
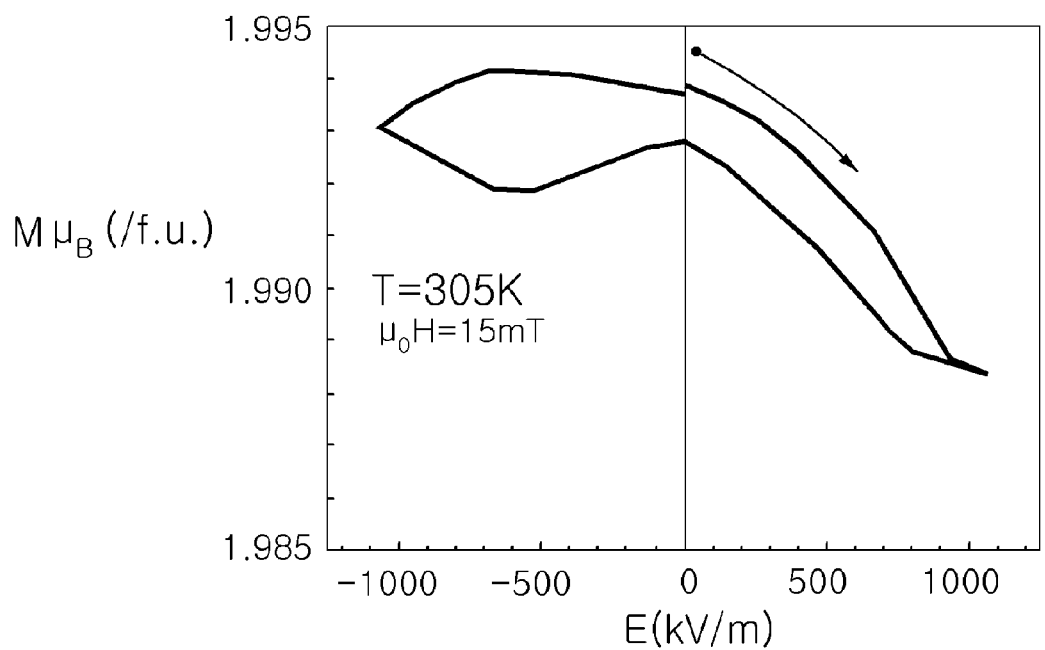
FIG. 3 is a graph illustrating a change in magnetic susceptibility of Y-type hexaferrite, which is induced by the electric field, according to the exemplary embodiment of the present invention at normal temperature.

FIG. 3 is a result obtained by inducing the change in magnetic susceptibility by applying the electric field to $(Ba_{0.15}Sr_{0.85})_2Co_2(Fe_{0.96}Al_{0.04})_{12}O_{22}$. The change in magnetic susceptibility of about 0.0058 $\mu_B$/f.u. may be induced by the electric field of about 1 MV/m. This is a change of 0.29% to the value of magnetic susceptibility in the case where the electric field is "0".

—Different Changes in Magnetic Susceptibility Induced by the Electric Field Varying According to the Magnetoelectric State—

Z-type hexaferrite $(Ba_{0.17}Sr_{0.83})_3Co_2Fe_{24}O_{41}$ may have total four magnetoelectric states by combining directions of the electric field ($\pm E_P$) and the magnetic field ($\pm H_P$) each vertically applied in order to arrange the magnetoelectric domains. The magnetoelectric state where the magnetoelectric domains are arranged may be maintained in the case where the external magnetic field is "0".

Figure 4:
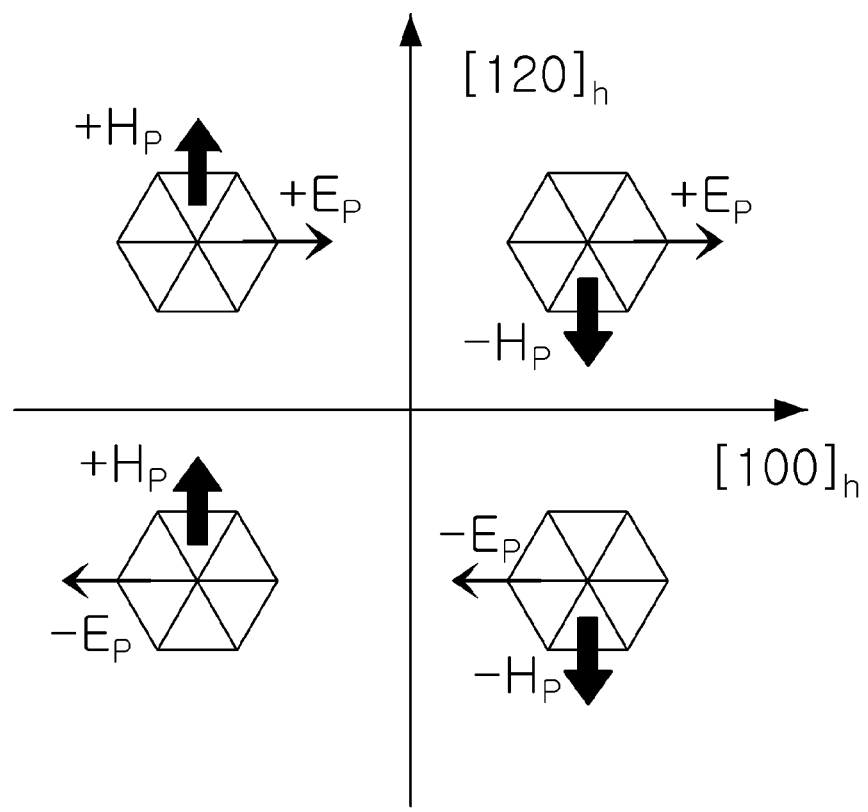
FIG. 4 is a graph illustrating four magnetoelectric states of Z-type hexaferrite according to the exemplary embodiment of the present invention.

FIG. 4 is a mimetic diagram illustrating the directions of the electric field and the magnetic field applied to arrange the magnetoelectric domains. The four magnetoelectric states may be represented by "$+H_P$ & $+E_P$", "$+H_P$ & $-E_P$", "$-H_P$ & $+E_P$", and "$-H_P$ & $-E_P$".

Figure 5:
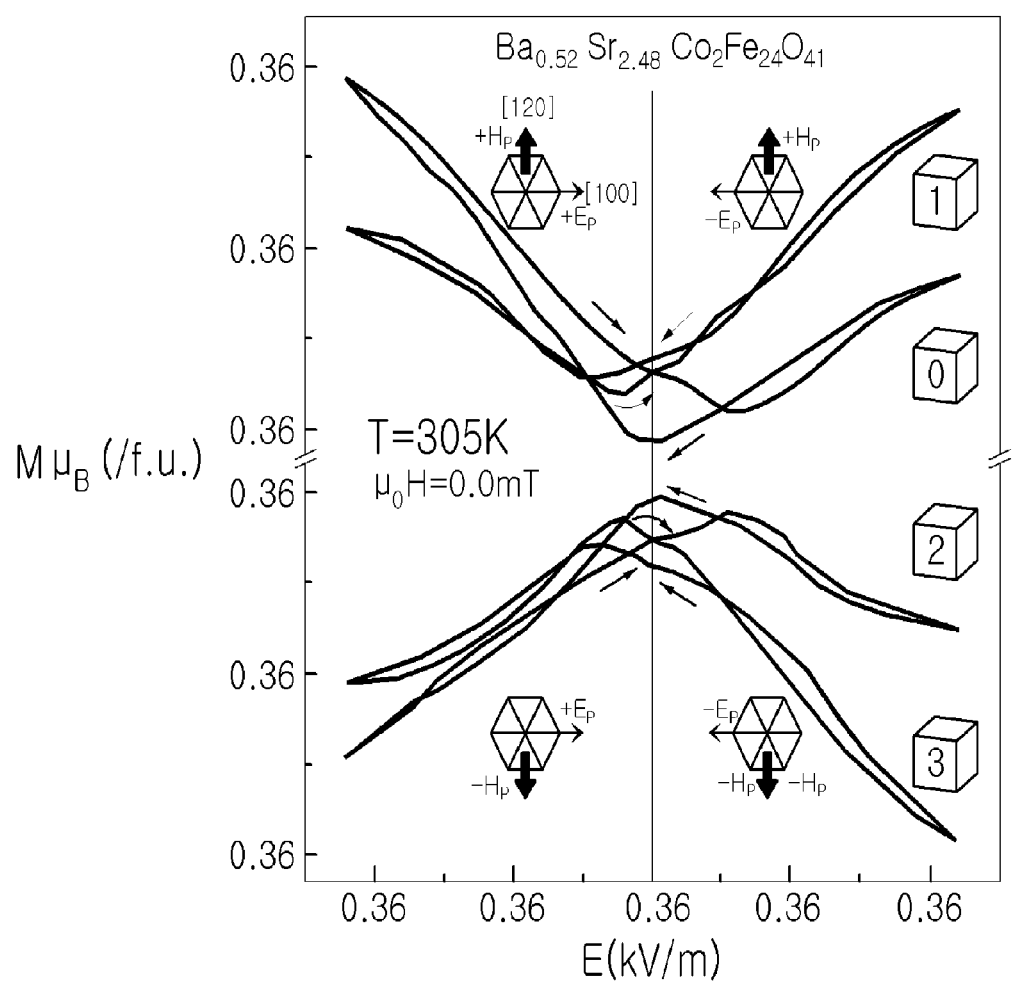
FIG. 5 is a graph illustrating a change in magnetic susceptibility, which is induced by the electric field, in each magnetoelectric state of Z-type hexaferrite according to the exemplary embodiment of the present invention.

FIG. 5 illustrates different results of the change in magnetic susceptibility induced by the electric field varying according to the magnetoelectric state when the external magnetic field is "0" at 305 K.

As illustrated in FIG. 5, if the electric field of about +1 MV/m is applied, the magnetoelectric states of "$+H_P$ & $+E_P$", "$+H_P$ & $-E_r$", "$-H_P$ & $+E_P$", and "$-H_P$ & $-E_P$" have the magnetic susceptibility of 0.355, 0.345, −0.345, and −0.355 $\mu_B$/f.u., respectively. If the electric field of about −1 MV/m is applied, the magnetoelectric states have the magnetic susceptibility of 0.36, 0.35, −0.355, and −0.35 $\mu_B$/f.u., respectively.

Change in Magnetic Property by Strontium ($Sr^{2+}$) Ion and Aluminum ($Al^{3+}$) Ion—

Figure 6:
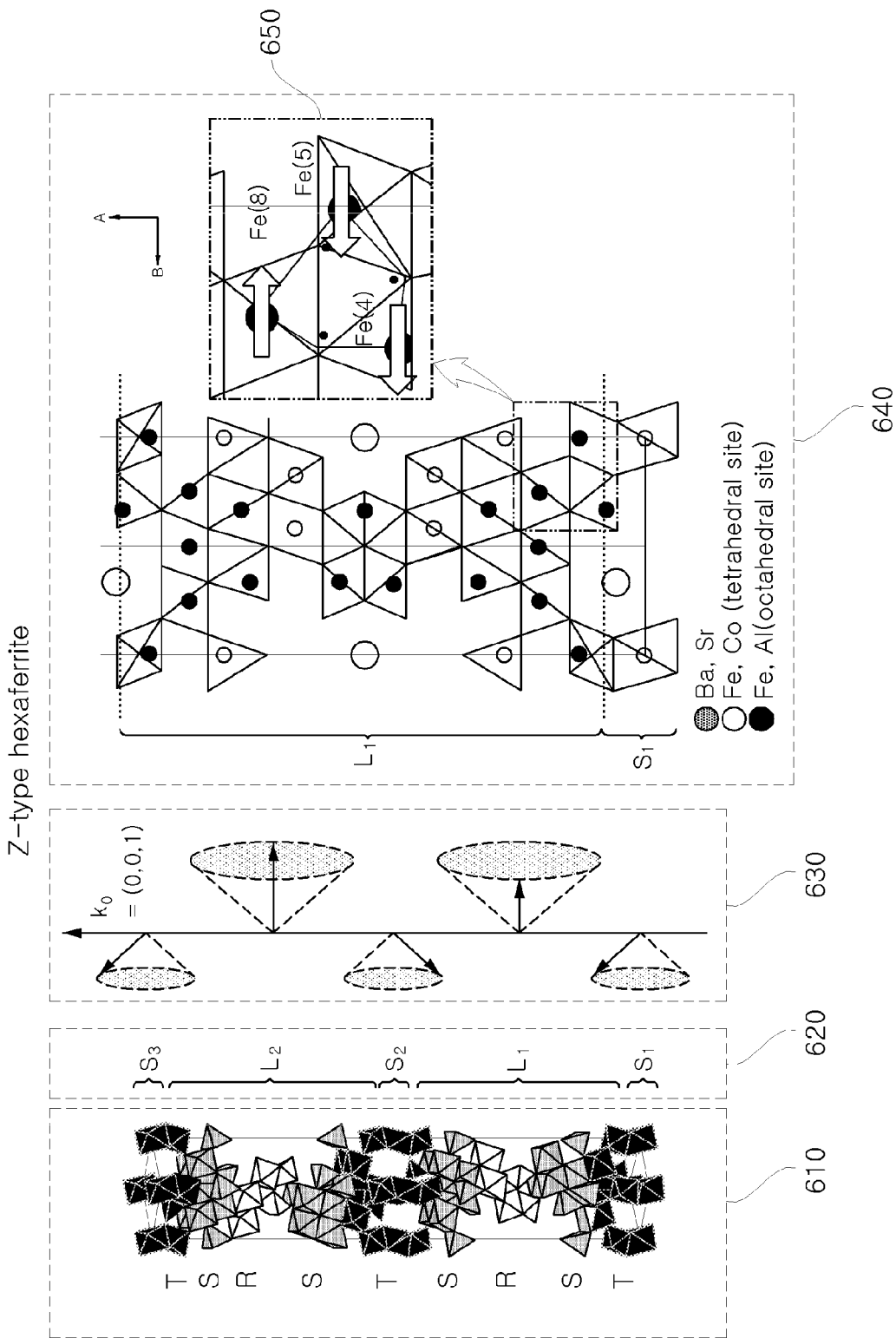
FIG. 6 is a schematic view illustrating a crystal structure and magnetic spin arrangement of Z-type hexaferrite of according to the exemplary embodiment of the present invention.
Figure 7:
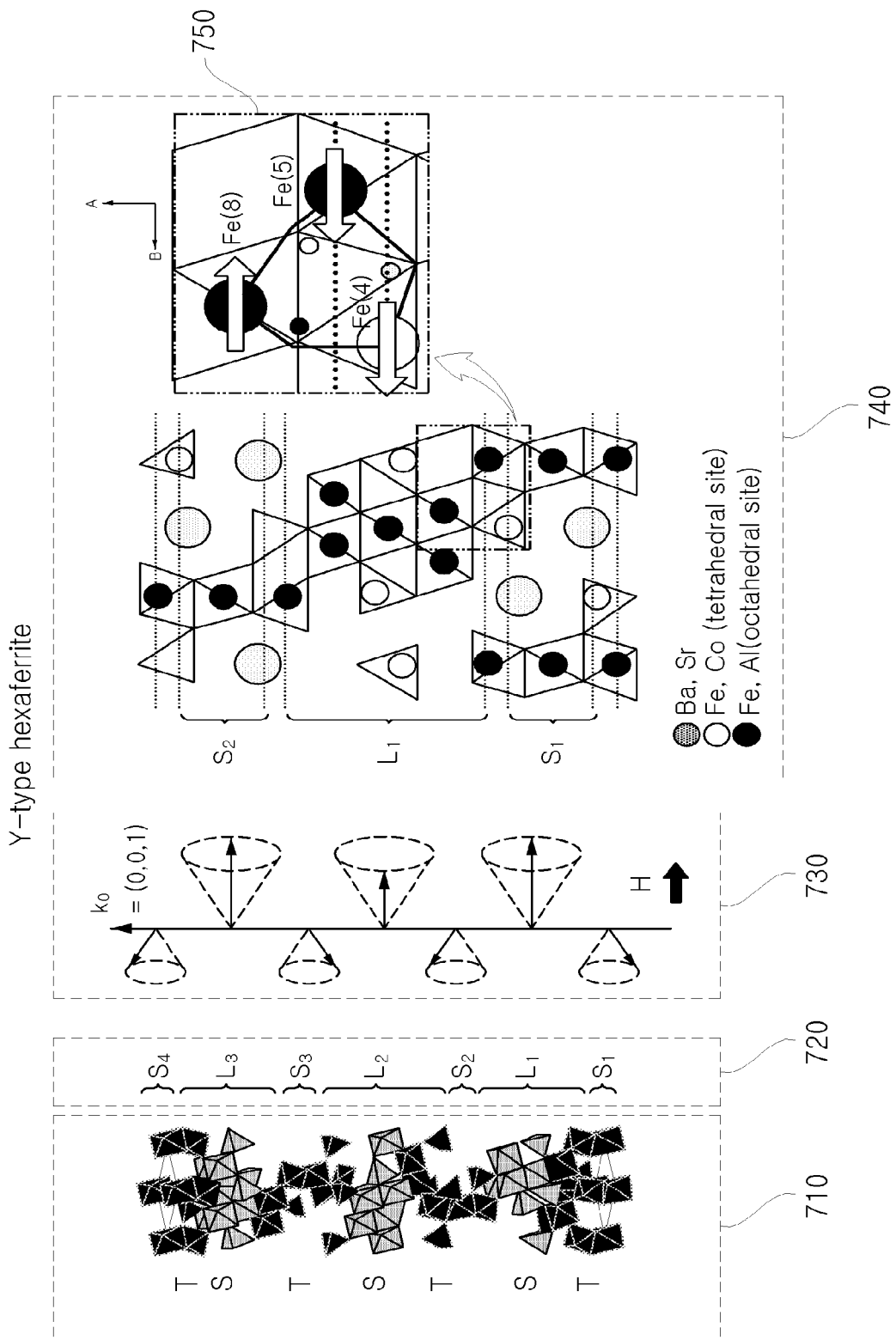
FIG. 7 is a schematic view illustrating a crystal structure and magnetic spin arrangement of Y-type hexaferrite of according to the exemplary embodiment of the present invention.

FIGS. 6 and 7 are schematic views illustrating the crystal structure and magnetic spin arrangement of Z-type and Y-type hexaferrites according to the exemplary embodiment of the present invention.

Herein, Z-type hexaferrite is represented by $(Ba_{1-x}Sr_x)_3Co_2(Fe_{1-y}Al_y)_{24}O_{41}$ ($0 \leq x \leq 1.0$, $0 \leq y \leq 0.8$), and Y-type hexaferrite is represented by $(Ba_{1-x}Sr_x)_2Co_2(Fe_{1-y}Al_y)_{12}O_{22}$ ($0 \leq x \leq 1.0$, $0 \leq y \leq 0.8$).

Referring to a crystal structure 610 and a magnetic structure 620 of FIG. 6, Z-type hexaferrite may have a layered structure and may be magnetically classified into an S-block and an L-block.

A moment 630 illustrated in FIG. 6 illustrates a transverse conical magnetic spin arrangement form feasible when the magnetic field is applied in a vertical direction to a crystallographical "c" axis of a $(Ba_{0.17}Sr_{0.83})_3Co_2Fe_{24}O_{41}$ single crystal. In an interaction 640 illustrated in FIG. 6, reference numeral 650 illustrates a ½ unit lattice when a crystal direction is B.

Referring to a crystal structure 710 and a magnetic structure 720 of FIG. 7, Y-type hexaferrite may have the layered structure and may be magnetically classified into the S-block and the L-block. A moment 730 illustrated in FIG. 7 illustrates the transverse conical magnetic spin arrangement form feasible when the magnetic field is applied in a vertical direction to the crystallographical "c" axis of a $(Ba_{0.15}Sr_{0.85})_2Co_2(Fe_{0.96}Al_{0.04})_{12}O_{22}$ single crystal. In an interaction 740 illustrated in FIG. 7, reference numeral 750 illustrates the ½ unit lattice when the crystal direction is B.

In the interactions 640 and 740 of FIGS. 6 and 7, a black sphere and a white sphere represent ions at a center of an octahedron and a center of a tetrahedron, respectively. The magnetic property and the electric property of Z-type and Y-type hexaferrites are determined by the interaction between the iron ions ($Fe^{3+}$) at the centers of the octahedron and the tetrahedron.

In unit lattices 650 and 750 of FIGS. 6 and 7, arrows represent magnetic spin directions determined by the interaction between the iron ions ($Fe^{3+}$) in the case of the $Ba_3Co_2Fe_{24}O_{41}$ and $Ba_3Co_2Fe_{12}O_{22}$ single crystals, respectively. Each magnetic spin arrangement is determined by adjacent Fe—O—Fe interaction (super exchange interaction). In general, the magnetic spins in the S-block and the L-block are arranged in an opposite direction to the adjacent other spins. However, Fe(4) and Fe(5) at a boundary of the S-block and the L-block are arranged in the same direction, and the reason is because the interaction of Fe(4)-O(2)-Fe(5) is relatively weak as compared to that of Fe(4)-O(6)-Fe(8) and Fe(5)-O(7)-Fe(8). In the above, numbers in brackets mean the order of the layered structures formed by atoms.

The intensity of the interaction of Fe—O—Fe around the boundary of the S-block and the L-block is described in the following Table 1.

TABLE 1

| Interaction between iron ions ($Fe^{3+}$) | | |
| --- | --- | --- |
| Fe(5)—O(7)—Fe(8) | Fe(4)—O(6)—Fe(8) | Fe(4)—O(2)—Fe(5) |
| Intensity Strong | Medium | Weak |

The strontium ion ($Sr^{3+}$) replaces the barium ion ($Ba^{2+}$) between the iron ions at the center of the octahedron or the tetrahedron. In this case, a distance of the interaction between the iron ions of Table 1 is changed by replacing the barium ion by the strontium ion having a small ion radius, and thus the intensity is changed. Accordingly, as illustrated in the moment 630 of FIG. 6, the transverse conical magnetic arrangement may be exhibited at high temperatures including normal temperature.

Most of the aluminum ion ($Al^{3+}$) replaces the iron ion ($Fe^{3+}$) at the center of the octahedron. In this case, the aluminum ion ($Al^{3+}$) having no magnetic property replaces the iron ion ($Fe^{3+}$) having the magnetic property to change the interaction between the iron ions ($Fe^{3+}$) determining the magnetic and electric properties, thus serving to reduce the magnetic anisotropy. If the magnetic anisotropy is reduced according to substitution of the aluminum ion ($Al^{3+}$), as illustrated in the moment 730 of FIG. 7, the transverse conical magnetic arrangement may be exhibited at high temperatures including normal temperature.

—Control of Magnetic Susceptibility Induced by Electric Field According to Transverse Conical Magnetic Arrangement—

As a theory of explaining a property of a material in which electric polarization, that is the electric property, is induced based on the magnetic property, there is a spin current model. According to the model, the electric polarization induced by the magnetic spin arrangement satisfies a relational expression of $\vec{P} \otimes \vec{K}_0(\vec{\mu}_S \times \vec{\mu}_L)$. Herein, $\vec{K}_0$ is a vector meaning a direction and a period where the magnetic arrangement spin is repeated, $\vec{\mu}_S$ means a pure magnetic moment of the S-block, and $\vec{\mu}_L$ means the pure magnetic moment of the L-block.

In the case of Z-type hexaferrite $(Ba_{1-x}Sr_x)_3Co_2(Fe_{1-y}Al_y)_{24}O_{41}$ ($0 \leq x \leq 1.0$, $0 \leq y \leq 0.8$) or Y-type hexaferrite $(Ba_{1-x}Sr_x)_2Co_2(Fe_{1-y}Al_y)_{12}O_{22}$ ($0 \leq x \leq 1.0$, $0 \leq y \leq 0.8$), when the magnetic field is applied in the vertical direction to the "c" axis, as illustrated in each moment 630 and 730 of FIGS. 6 and 7, since the transverse conical magnetic arrangement occurs, the magnetic polarizability may be induced in the relation expression. Meanwhile, on the contrary to this, if the electric field is applied to change the electric polarization, the magnetic arrangement may be affected to induce the change in magnetic susceptibility.

—Method of Manufacturing Magnetoelectric Material—

Figure 8:
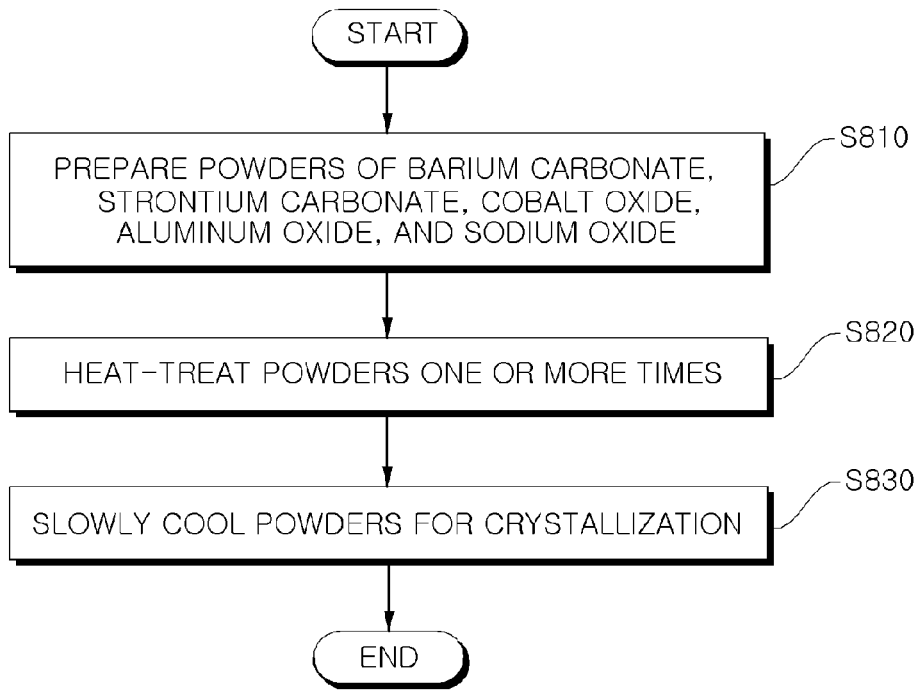
FIG. 8 is a flowchart illustrating a method of manufacturing a magnetoelectric material according to the exemplary embodiment of the present invention.

FIG. 8 is a flowchart illustrating the method of manufacturing the magnetoelectric material according to the exemplary embodiment of the present invention.

Referring to FIG. 8, powders of barium carbonate ($BaCo_3$), strontium carbonate ($SrCo_3$), cobalt oxide (CoO), iron oxide ($Fe_2O_3$), aluminum oxide ($Al_2O_3$), and sodium oxide ($Na_2O$) are prepared (S810).

In the present exemplary embodiment, the powder including calcium carbonate or an yttrium group element instead of barium carbonate and strontium carbonate may be used.

In the present exemplary embodiment, the powder including at least one of magnesium, nickel, copper, and manganese instead of cobalt oxide may be used. In the present exemplary embodiment, cobalt oxide serves to increase a resistance value at normal temperature and increase the magnetic arrangement.

In the present exemplary embodiment, the powder including gallium instead of aluminum oxide may be used. In the present exemplary embodiment, aluminum oxide serves as a doping agent.

The following Table 2 describes molar ratios required in the course of preparing the powders.

TABLE 2

| | Molar ratio |
| --- | --- |
| Barium carbonate | $A_1(1 - x')$ |
| Strontium carbonate | $A_1 x'$ |
| Cobalt oxide | $A_2$ |
| Iron oxide | $A_3(1 - y)$ |
| Aluminum oxide | $A_3 y$ |
| Sodium oxide | $A_4$ |

Referring to Table 2, the molar ratios of barium carbonate, strontium carbonate, cobalt oxide, iron oxide, aluminum oxide, and sodium oxide are $A_1(1-x')$, $A_1 x'$, $A_2$, $A_3(1-y)$, $A_3 y$, and $A_4$, respectively.

Herein, $A_1$, $A_2$, $A_3$, and $A_4$ are selected in the range of $15 \leq A_1 \leq 25$, $15 \leq A_2 \leq 25$, $40 \leq A_3 \leq 60$, and $5 \leq A_4 \leq 10$, respectively, so that a sum of the molar ratios is 100 and a sum of $A_1$, $A_2$, $A_3$, and $A_4$ satisfies 100. x' and y are selected in the range of $0 \le x' \le 1.0$ and $0 \le y \le 0.8$.

The molar ratios are required in order to finally obtain Z-type and Y-type hexaferrites of the single crystal represented by $(Ba_{1-x}Sr_x)_3Co_2(Fe_{1-y}Al_y)_{24}O_{41}$ and $(Ba_{1-x}Sr_x)_2Co_2(Fe_{1-y}Al_y)_{12}O_{22}$ ($0 \le x \le 1.0$, $0 < y \le 0.8$) in consideration of the components removed as an impurity such as $CoFe_2O_4$.

Herein, the temperatures of the powders may be in a normal temperature state of about 260K to about 400K, but are not limited thereto, and are enough as long as the temperatures are in a temperature state at which a solid powder state is capable of being maintained. Preferably, the temperatures of the powders may be about 25° C. (298K).

Subsequently, the powders are heat-treated one or more times (S820).

Specifically, the powders may be put into a platinum crucible and the platinum crucible may be added to an electric furnace to perform the heat-treating, and the heat-treating may be finely divided to include i) heating the powders to the first temperature, ii) maintaining the powders at the first temperature, and iii) cooling the powders to the second temperature that is lower than the first temperature.

Herein, in the case where the first temperature is less than about 1,000° C., it is difficult to form a melting state. On the other hand, in the case where the first temperature is more than about 1,500° C., since the temperature is excessively high, it is difficult to perform controlling, and surrounding impurities may be dissolved to be contained. Accordingly, the first temperature may be about 1,000° C. to about 1,500° C.

In the case where the second temperature is less than about 900° C., excessive energy is required to heat the powders back to the first temperature, and thus a yield is reduced. On the other hand, in the case where the second temperature is more than about 1,200° C., it is not easy to remove the impurity such as $CoFe_2O_4$. Accordingly, the second temperature may be set to be lower than the first temperature in the range of about 900° C. to about 1,200° C.

In the case where in the heating to the first temperature, the temperature increase ratio is less than about 50° C./h, since a time reaching the final first temperature is lengthened, a production yield is reduced. On the other hand, in the case where the temperature increase ratio is more than about 1,500° C./h, since a heating time is relatively short, it is not easy to control the temperature. Accordingly, in the heating to the first temperature, the temperature increase ratio may be about 50° C./h to 1,500° C./h.

In the cooling to the second temperature that is lower than the first temperature, in the case where the temperature decrease ratio is less than about 50° C./h, since a time reaching the second temperature is lengthened, the production yield is reduced. On the other hand, in the case where the temperature decrease ratio is more than about 1,500° C./h, since a cooling time is relatively short, it is not easy to control the temperature. Accordingly, in the cooling to the second temperature that is lower than the first temperature, the temperature decrease ratio may be about 50° C./h to about 1,500° C./h.

As described above, the heat-treating including i) heating the powders to the first temperature, ii) maintaining the powders at the first temperature, and iii) cooling the powders to the second temperature that is lower than the first temperature may be repeatedly performed in order to effectively remove the impurity such as $CoFe_2O_4$.

Figure 9:
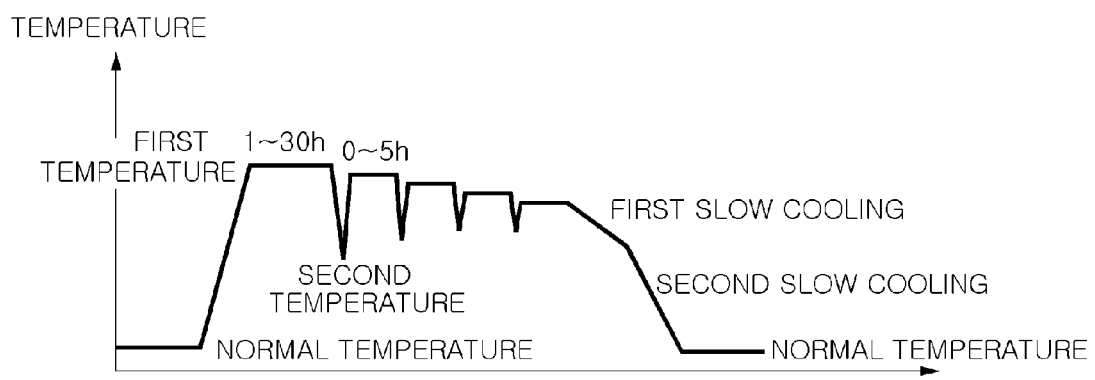
FIG. 9 is a view schematically illustrating repeatedly performed heat-treating.

FIG. 9 is a view schematically illustrating the repeatedly performed heat-treating.

Referring to FIG. 9, in order to increase impurity removing efficiency and improve the yield, the first temperature may be sequentially reduced or maintained to be the same as the temperature at the previous heat-treating step whenever the heat-treating is performed, and the second temperature may be sequentially increased or maintained to be the same as the temperature at the previous heat-treating step whenever the heat-treating is performed.

In the case where the time when the temperature is maintained at the first temperature is less than about 5 hours in the initial heat-treating, since the solid powders are not sufficiently changed into a liquid phase, the powders may remain in the liquid phase. On the other hand, in the case where the time when the temperature is maintained at the first temperature is more than about 30 hours in the initial heat-treating, even though the change of the powders to the liquid phase is completed, energy may be unnecessarily consumed in heating. Accordingly, the time when the temperature is maintained at the first temperature in the initial heat-treating may be about 5 hours to about 30 hours.

Thereafter, the time when the temperature is maintained at the first temperature in heat-treating may be about 5 hours or less, which is shorter than the initial temperature stage, and the reason is because only energy that is lower than energy required when the solid phase is changed into the liquid phase at an initial stage is required.

Subsequently, slow cooling is performed for crystallization (S830).

In the case where the temperature decrease ratio is less than about 0.1° C./h in the slow cooling, since a decrease ratio is relatively low, a production yield may be reduced. On the other hand, in the case where the temperature decrease ratio is more than about 100° C./h, the crystal structure is not formed of the single crystal. Therefore, the temperature decrease ratio in the slow cooling may be about 0.1° C./h to about 100° C./h.

The slow cooling may be performed by first slow cooling performed at about 0.1° C./h to about 10° C./h and second slow cooling performed at about 10° C./h to about 100° C./h. This is because the manufacturing time can be shortened by performing the second slow cooling at the temperature decrease ratio of about 10° C./h to about 100° C./h which is relatively larger than that of the first slow cooling after the first slow cooling is performed at the temperature decrease ratio of about 0.1° C./h to about 10° C./h at which the single crystal is capable of being stably formed.

Herein, the temperature of the finally cooled magnetoelectric material may be in a normal temperature state of about 260K to about 400K, but is not limited thereto, and is enough as long as the temperature is a temperature at which the magnetoelectric material can be maintained in the solid phase. For example, the temperature of the magnetoelectric material may be slowly cooled to about 25° C. (298K).

—Manufacturing Experiment of Magnetoelectric Material—

In the preparing of the powders of barium carbonate, strontium carbonate, cobalt oxide, iron oxide, aluminum oxide, and sodium oxide in which the molar ratio is $A_1(1-x')$, $A_1x'$, $A_2$, $A_3(1-y)$, $A_3y$, and $A_4$, $A_1$, $A_2$, $A_3$, and $A_4$ may be selected in the range of $15 \le A_1 \le 25$, $15 \le A_2 \le 25$, $40 \le A_3 \le 60$, and $5 \le A_4 \le 10$ In Z-type hexaferrite, $A_1$, $A_2$, $A_3$, and $A_4$ were respectively selected to be 20.1, 17.7, 55.0, and 7.2, such that the sum of $A_1$, $A_2$, $A_3$, and $A_4$ is 100. Specifically, the powders were prepared so that the molar ratios are represented by those of the following Table 3.

TABLE 3

| | Molar ratio |
|---|---|
| Barium carbonate | 20.1(1 − x') |
| Strontium carbonate | 20.1x' |
| Cobalt oxide | 17.7 |
| Iron oxide | 55.0(1 − y) |
| Aluminum oxide | 55.0y |
| Sodium oxide | 7.2 | y was selected to be 0.00 in the range of $0 \leq y \leq 0.8$, and five x's were selected in the range of $0 \leq x' \leq 1.0$ to be classified into five Examples as described in the following Table 4.

TABLE 4

| | x' |
|---|---|
| Example 1 | 0.5 |
| Example 2 | 0.6 |
| Example 3 | 0.7 |
| Example 4 | 0.8 |
| Example 5 | 0.9 |

Meanwhile, in Y-type hexaferrite, $A_1$, $A_2$, $A_3$, and $A_4$ were respectively selected to be 19.69, 19.69, 53.61, and 7.01, such that the sum of $A_1$, $A_2$, $A_3$, and $A_4$ is 100. Specifically, the powders were prepared so that the molar ratios are those described in the following Table 5.

TABLE 5

| | Molar ratio |
|---|---|
| Barium carbonate | 19.69(1 − x') |
| Strontium carbonate | 19.69x' |
| Cobalt oxide | 19.69 |
| Iron oxide | 53.61(1 − y) |
| Aluminum oxide | 53.61y |
| Sodium oxide | 7.01 | y was selected to be 0.04 in the range of $0 \leq y \leq 0.8$, and eleven x's were selected in the range of $0 \leq x' \leq 1.0$ to be classified into five Examples described in the following Table 6.

TABLE 6

| | x' |
|---|---|
| Example 6 | 0.5 |
| Example 7 | 0.6 |
| Example 8 | 0.7 |
| Example 9 | 0.8 |
| Example 10 | 0.9 |

Subsequently, the powders were put into the platinum crucible, the platinum crucible was added to the electric furnace, the heat-treating was performed ten times, the first slow cooling was performed at about 1° C./h, and the second slow cooling was performed at about 50° C./h. Conditions of the heat-treating and the slow cooling are described in the following Table 7.

TABLE 7

| First | Normal temperature 1200° C./h --→ | 1420° C. (maintained for 20 hours) | 1200° C./h --→ | 1100° C. |
|---|---|---|---|---|
| Second | 1200° C./h --→ | 1395° C. (maintained for 1 hour) | 1200° C./h --→ | 1120° C. |
| Third | 1200° C./h --→ | 1370° C. (maintained for 1 hour) | 1200° C./h --→ | 1140° C. |
| Fourth | 1200° C./h --→ | 1340° C. (maintained for 1 hour) | 1200° C./h --→ | 1160° C. |
| Fifth | 1200° C./h --→ | 1320° C. (maintained for 1 hour) | 1200° C./h --→ | 1180° C. |
| Sixth | 1200° C./h --→ | 1295° C. (maintained for 1 hour) | 1200° C./h --→ | 1185° C. |
| Seventh | 1200° C./h --→ | 1270° C. (maintained for 1 hour) | 1200° C./h --→ | 1185° C. |
| Eighth | 1200° C./h --→ | 1420° C. (maintained for 20 hours) | 1200° C./h --→ | 1185° C. |
| Ninth | 1200° C./h --→ | 1220° C. (maintained for 1 hour) | 1200° C./h --→ | 1185° C. |
| Tenth | 1200° C./h --→ | 1195° C. (maintained for 1 hour) | 1200° C./h --→ | 1185° C. |
| Slow cooling | 1° C./h --→ | 1100° C. | 50° C./h --→ | Normal temperature |

In the following Table 8, twelve Examples finally obtained through the aforementioned processes are described.

TABLE 8

| | x' | x | Final hexaferrite |
|---|---|---|---|
| Example 1 | 0.5 | 0.32 | $(Ba_{0.68}Sr_{0.32})_3Co_2Fe_{24}O_{41}$ |
| Example 2 | 0.6 | 0.40 | $(Ba_{0.60}Sr_{0.40})_3Co_2Fe_{24}O_{41}$ |
| Example 3 | 0.7 | 0.52 | $(Ba_{0.48}Sr_{0.52})_3Co_2Fe_{24}O_{41}$ |
| Example 4 | 0.8 | 0.68 | $(Ba_{0.32}Sr_{0.68})_3Co_2Fe_{24}O_{41}$ |
| Example 5 | 0.9 | 0.83 | $(Ba_{0.17}Sr_{0.83})_3Co_2Fe_{24}O_{41}$ |
| Example 6 | 0.5 | 0.32 | $(Ba_{0.68}Sr_{0.32})_2Co_2(Fe_{0.96}Al_{0.04})_{12}O_{22}$ |
| Example 7 | 0.6 | 0.41 | $(Ba_{0.59}Sr_{0.41})_2Co_2(Fe_{0.96}Al_{0.04})_{12}O_{22}$ |
| Example 8 | 0.7 | 0.53 | $(Ba_{0.47}Sr_{0.53})_2Co_2(Fe_{0.96}Al_{0.04})_{12}O_{22}$ |
| Example 9 | 0.8 | 0.68 | $(Ba_{0.32}Sr_{0.68})_2Co_2(Fe_{0.96}Al_{0.04})_{12}O_{22}$ |
| Example 10 | 0.9 | 0.83 | $(Ba_{0.17}Sr_{0.83})_2Co_2(Fe_{0.96}Al_{0.04})_{12}O_{22}$ |

As described in Table 8, it can be seen that hexaferrites corresponding to Examples 1 to 5 finally obtained through the aforementioned experiment are included in the range of $(Ba_{1-x}Sr_x)_3Co_2(Fe_{1-y}Al_y)_{24}O_{41}$ ($0 \leq x \leq 1.0$, $0 \leq y \leq 0.8$), and hexaferrites corresponding to Examples 6 to 10 are included in the range of $(Ba_{1-x}Sr_x)_2Co_2(Fe_{1-y}Al_y)_{12}O_{22}$ ($0 \leq x \leq 1.0$, $0 \leq y \leq 0.8$).

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

This invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. Therefore, it is to be understood that within the scope of the appended claims, the invention may be practiced otherwise than as specifically described.

What is claimed is:

1. A magnetoelectric material which is a Y-type or Z-type hexaferrite material comprising:
    non-magnetic ions corresponding to aluminum (Al) ions or gallium (Ga) ions;
    metal ions including first ions and second ions, the first ions corresponding to barium (Ba), the second ions corresponding to at least one of strontium (Sr) ions, calcium (Ca) ions, scandium (Sc) ions, yttrium (Y) ions, gadolinium (Gd) ions, terbium (Tb) ions, dysprosium (Dy) ions, holmium (Ho) ions, erbium (Er) ions, thulium (Tm) ions, ytterbium (Yb) ions, and lutetium (Lu) ions;
    improvement ions increasing a resistance value and a degree of magnetic arrangement at a normal temperature, the improvement ions corresponding to at least one of manganese (Mn) ions, cobalt (Co) ions, nickel (Ni) ions, copper (Cu) ions, magnesium (Mg) ions, and zinc (Zn) ions; and
    magnetic ions interacting with each other and corresponding to iron (Fe) ions,
    wherein a distance between the magnetic ions is controlled by the non-magnetic ions or the metal ions.

2. The magnetoelectric material of claim 1, wherein the magnetoelectric material is a single crystal in which a magnetic property is controlled by an electric field at the normal temperature.

3. The magnetoelectric material of claim 1, wherein the distance between the magnetic ions is controlled by positioning a corresponding non-magnetic ion between adjacent magnetic ions, or the distance between the magnetic ions is controlled by substituting some of first ions by the second ions.

4. The magnetoelectric material of claim 1, wherein the non-magnetic ions are substituted for a portion of the magnetic ions.

5. The magnetoelectric material of claim 1, wherein a substitution ratio of the non-magnetic ions for the magnetic ions is more than 0% and less than 80%.

6. The magnetoelectric material of claim 1, wherein the magnetoelectric material is manufactured by mixing barium carbonate including the Ba ions as the first ions, strontium carbonate including the Sr ions as the second ions, iron oxide including Fe ions as the magnetic ions, aluminum oxide including the Al ions as the non-magnetic ions, cobalt oxide including the Co ions as the improvement ions, and sodium oxide.

7. The magnetoelectric material of claim 6, wherein the magnetoelectric material is manufactured by mixing the barium carbonate, the strontium carbonate, the iron oxide, the aluminum oxide, the cobalt oxide, and the sodium oxide according to respective molar ratios represented in the following Equation:

Molar ratio of the barium carbonate=$A_1(1-x')$;

Molar ratio of the strontium carbonate=$A_1(x')$;

Molar ratio of the cobalt oxide=$A_2$;

Molar ratio of the iron oxide=$A_3(1-y)$;

Molar ratio of the aluminum oxide=$A_3 y$; and

Molar ratio of the sodium oxide=$A_4$, [Equation]

wherein $15 \leq A_1 \leq 25$, $15 \leq A_2 \leq 25$, $40 \leq A_3 \leq 60$, $5 \leq A_4 \leq 10$, $A_1+A_2+A_3+A_4=100$, $0<x' \leq 1.0$, and $0<y \leq 0.8$.

8. The magnetoelectric material of claim 6, wherein the magnetoelectric material is manufactured as a crystal by:
    mixing the barium carbonate, the strontium carbonate, the iron oxide, the aluminum oxide, the cobalt oxide, and the sodium oxide;
    performing heat-treating at least one time; and
    performing slow cooling.

9. The magnetoelectric material of claim 1, wherein the distance between the magnetic ions is controlled by positioning a corresponding non-magnetic ion between adjacent magnetic ions.

10. A method of manufacturing a magnetoelectric material which is a Y-type or Z-type hexaferrite material, comprising:
    mixing a first powder including magnetic ions that correspond to iron (Fe) ions, a second powder including non-magnetic ions that correspond to aluminum (Al) ions or gallium (Ga) ions, a third powder including metal ions, the metal ions including first ions and second ions, the first ions corresponding to barium (Ba), the second ions corresponding to at least one of strontium (Sr) ions, calcium (Ca) ions, scandium (Sc) ions, yttrium (Y) ions, gadolinium (Gd) ions, terbium (Tb) ions, dysprosium (Dy) ions, holmium (Ho) ions, erbium (Er) ions, thulium (Tm) ions, ytterbium (Yb) ions, and lutetium (Lu) ions, and a fourth powder including improvement ions, the improvement ions corresponding to at least one of manganese (Mn), cobalt (Co), nickel (Ni), copper (Cu), magnesium (Mg), and zinc (Zn);
    heat-treating the mixed powders at least one time, wherein the heat-treating includes heating the mixed powders to a first temperature that is in a range from 1,100° C. to 1,500° C., maintaining the first temperature for a first time that is in a range from 5 hours to 30 hours, and cooling the mixed powders to a second temperature that is in a range from 900° C. to 1,200° C.; and
    slowly cooling the heat-treated powders at least one time with a predetermined temperature decrease rate that is in a range from 0.1° C./h to 100° C./h to manufacture a crystal.

11. A magnetoelectric material which is a Y-type or Z-type hexaferrite material comprising:
    non-magnetic ions corresponding to aluminum ions or gallium ions;
    metal ions including first ions and second ions, the first ions corresponding to barium ions, the second ions corresponding to at least one of strontium (Sr) ions, calcium (Ca) ions, scandium (Sc) ions, yttrium (Y) ions, gadolinium (Gd) ions, terbium (Tb) ions, dysprosium (Dy) ions, holmium (Ho) ions, erbium (Er) ions, thulium (Tm) ions, ytterbium (Yb) ions, and lutetium (Lu) ions;
    improvement ions increasing a resistance value and a degree of magnetic arrangement at a normal temperature, the improvement ions corresponding to at least one of manganese (Mn) ions, cobalt (Co) ions, nickel (Ni) ions, copper (Cu) ions, magnesium (Mg) ions, and zinc (Zn) ions; and
    magnetic ions interacting with each other and corresponding to iron (Fe) ions, wherein the non-magnetic ions or the second ions cause an electric property of the magnetoelectric material to be changed by applying a magnetic field or a magnetic property of the magnetoelectric material to be changed by applying an electric field.

\* \* \* \* \*